(12) United States Patent
Böhlmark et al.

(10) Patent No.: US 8,758,890 B2
(45) Date of Patent: Jun. 24, 2014

(54) MULTILAYERED COATED CUTTING TOOL

(75) Inventors: Johan Böhlmark, Stockholm (SE); Helen Blomqvist, Enskede gård (SE)

(73) Assignee: Sandvik Intellectual Property AB, Sandviken (SE)

( * ) Notice: Subject to any disclaimer, the term of this patent is extended or adjusted under 35 U.S.C. 154(b) by 220 days.

(21) Appl. No.: 12/959,835

(22) Filed: Dec. 3, 2010

(65) Prior Publication Data
US 2011/0135898 A1   Jun. 9, 2011

Related U.S. Application Data

(60) Provisional application No. 61/286,242, filed on Dec. 14, 2009.

(30) Foreign Application Priority Data

Dec. 4, 2009  (EP) ..................................... 09015041

(51) Int. Cl.
| | |
|---|---|
| *B32B 7/02* | (2006.01) |
| *B32B 15/04* | (2006.01) |
| *C23C 16/00* | (2006.01) |
| *C23C 14/00* | (2006.01) |
| *C23C 30/00* | (2006.01) |
| *C23C 28/00* | (2006.01) |

(52) U.S. Cl.
CPC ................. *C23C 14/00* (2013.01); *C23C 30/00* (2013.01); *C23C 28/00* (2013.01)
USPC ........... 428/216; 428/698; 428/457; 428/212; 428/547; 428/697; 51/307; 51/309; 427/249.15; 427/255.7

(58) Field of Classification Search
None
See application file for complete search history.

(56) References Cited

U.S. PATENT DOCUMENTS

| | | | |
|---|---|---|---|
| 2006/0222893 A1 | 10/2006 | Derflinger | |
| 2006/0269788 A1* | 11/2006 | Ishikawa | ...................... 428/698 |
| 2007/0269610 A1 | 11/2007 | Fukui et al. | |

FOREIGN PATENT DOCUMENTS

| | | |
|---|---|---|
| CN | 1876368 | 12/2006 |
| CN | 101090790 | 12/2007 |

(Continued)

OTHER PUBLICATIONS

L.A. Dobrzanski et al., "Improvement of tool materials by deposition of gradient and multilayers coatings," Journal of Achievements in Materials and Manufacturing Engineering, vol. 19, No. 2, Dec. 1, 2006, pp. 86-91.

(Continued)

*Primary Examiner* — David Sample
*Assistant Examiner* — Nicole T Gugliotta
(74) *Attorney, Agent, or Firm* — Morgan, Lewis & Bockius LLP

(57) ABSTRACT

A coated cutting tool includes a substrate and a PVD coating having an outermost zone C being a nitride, carbide, boride, or mixtures thereof, of Si and at least two additional elements selected from Al, Y, and groups 4, 5 or 6 of the periodic table and zone C is free from a compositional gradient of an average content of Si. Zone C has a laminar, aperiodic, multilayered structure with alternating individual layers X and Y having different compositions from each other. The coating further includes a zone A closest to the substrate, a transitional zone B, where zone A is essentially free from Si, zone B includes a compositional gradient of the average content of Si, and where the average content of Si is increasing towards zone C.

16 Claims, 1 Drawing Sheet

(56) References Cited

FOREIGN PATENT DOCUMENTS

| | | | |
|---|---|---|---|
| CN | 101209611 | 7/2008 | |
| CN | 101578396 | 11/2009 | |
| EP | 1726686 | 11/2006 | |
| EP | 1 939 327 | 7/2008 | |
| EP | 1939328 | 7/2008 | |
| JP | 2004-066361 | * 3/2004 | ............ B32B 27/14 |
| JP | 2006-299399 | 11/2006 | |
| WO | WO 2008/130316 | 10/2008 | |
| WO | WO 2009/128782 | 10/2009 | |
| WO | WO 2010/150335 | 12/2010 | |

OTHER PUBLICATIONS

Chinese Office Action for Applicaiton No. 201010583228.X dated Dec. 4, 2013.

* cited by examiner

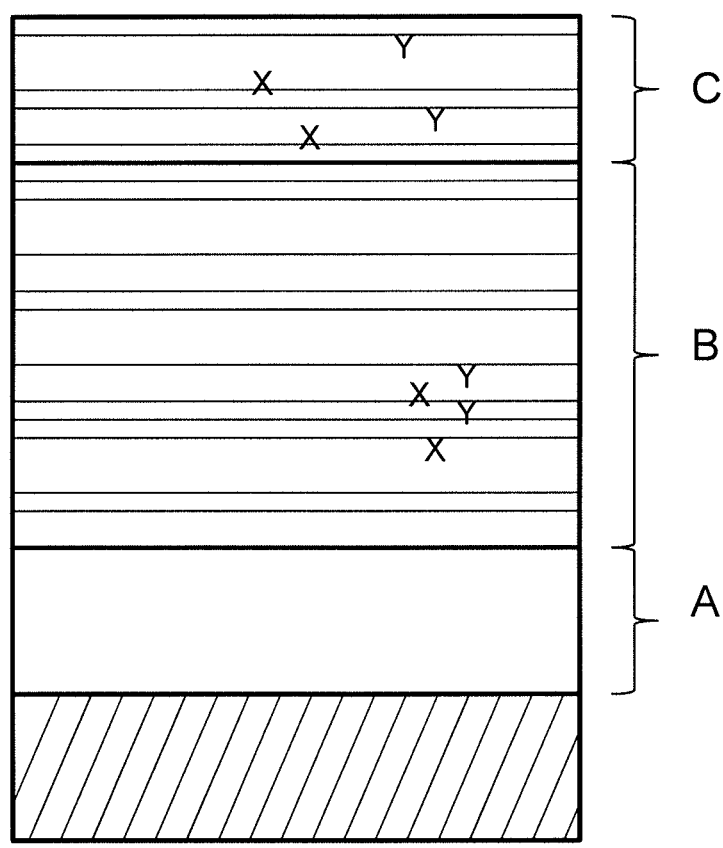

MULTILAYERED COATED CUTTING TOOL

RELATED APPLICATION DATA

This application is based on and claims priority under 37 U.S.C. §119 to European Application No. 09015041.8, filed Dec. 4, 2009, and claims priority under 35 U.S.C. §119(e) to U.S. Provisional Application No. 61/286,242, filed on Dec. 14, 2009, the entire contents of both of which are incorporated herein by reference.

TECHNICAL FIELD

Embodiments relate to a cutting tool coated with a PVD coating having an aperiodic, multilayered structure which has an increased toughness towards the substrate. In particular, the embodiments relate to a such a coating comprising a (Ti,Al,Cr, Si)N layer with a compositional gradient.

BACKGROUND

In the discussion of the background that follows, reference is made to certain structures and/or methods. However, the following references should not be construed as an admission that these structures and/or methods constitute prior art. The inventors expressly reserve the right to demonstrate that such structures and/or methods do not qualify as prior art.

Cutting tools are usually provided with a coating deposited by either physical vapour deposition (PVD) or chemical vapour deposition (CVD) to increase the tool life. Common PVD coatings for cutting tools are nitrides of Ti, Al, Cr and Si. Nitrides containing silicon are known to have a high hardness and very good wear resistance. (Ti,Al,Cr,Si)N PVD coatings having a high hardness are also known in the art.

EP 1939328 A1 describes a cutting tool comprising a substrate and a coating. The coating comprises an aperiodic, multilayered structure of alternating individual metal nitride layers X and Y of different composition where the average composition of the coating is $(Ti_{(1-a-b-c)}Al_aCr_bSi_c)N$ where $0<a<0.5$, $0<b<0.15$, $0.01<c<0.17$, and $a+b+c<1$.

US 2006/0222893 A1 discloses a multilayer coating comprising repeated layer stacks comprising at least one, 50-150 nm, (Al,Cr)N layer and/or at least one, 75-200 nm, (Ti,Si)N layer and at least one layer stack of (Al,Cr,Ti,Si)N+(Ti,Si)N+(Al,Cr,Ti,Si)N+(Al,Cr)N. The mixed (Al,Cr,Ti,Si)N layers have a multilayered structure and are achieved by running all targets simultaneously. The (Al,Cr,Ti,Si)N layer has a thickness of 20±10 nm.

EP 1 726 686 A1 discloses a hard-coated member comprising a coating comprising a lowermost layer, an intermediate laminate layer and an outermost layer where the lowermost and outermost layers are homogenous layers. The intermediate laminate layer comprises alternating layers A and B, where A and B are nitrides, borides, carbides and oxides of the metal components $Al_wCr_xTi_ySi_z$.

Although such hard coatings have relatively good wear resistance, they can also be brittle, which may cause problems, like flaking, when deposited onto substrates which have high toughness and also onto substrates having sharp geometries. If the coating also has high residual compressive stresses the flaking can be even worse, especially around cutting edges, corners on drills, etc.

SUMMARY

Embodiments can provide a coated cutting tool having a coating with improved resistance towards flaking without decreasing the surface hardness. Other embodiments can provide a hard coating which is more suitable for tough substrates. This can be achieved by the coated cutting tool and the method as described herein.

A coated cutting tool in accordance with an exemplary embodiment of the invention comprises a substrate and a PVD coating comprising an outermost zone C being a nitride, carbide, boride, or mixtures thereof, of Si and at least two additional elements selected from Al, Y and groups 4, 5 and 6 of the periodic table and where zone C is free from a compositional gradient of the average content of Si. Zone C has an aperiodic, multilayered structure of alternating individual layers X and Y having different compositions from each other. The coating further comprises a zone A closest to the substrate and a transitional zone B, where:

zone A is essentially free from Si, and zone B comprises a compositional gradient of the average content of Si, where the average content of Si is increasing towards zone C.

Zone B preferably also has an aperiodic, multilayered structure with alternating individual layers X and Y having different compositions from each other.

A method in accordance with an exemplary embodiment of the invention comprises the steps of providing a substrate of cemented carbide, cermets, ceramics, cubic boron nitride or high speed steel, onto said substrate depositing, by PVD technique, a coating comprising an outermost zone C being a nitride, carbide, boride, or mixtures thereof, of Si and at least two additional elements selected from Al, Y and groups 4, 5 or 6 of the periodic table, where zone C is free from a compositional gradient of the average content of Si, and where zone C has an aperiodic, multilayered structure of alternating individual layers X and Y having different compositions from each other. The coating further comprises a zone A closest to the substrate and a transitional zone B between zone A and zone C, where:

zone A is essentially free from Si, and zone B comprises a compositional gradient of the average content of Si, where the average content of Si is increasing towards zone C.

Zone B preferably also has an aperiodic, multilayered structure of alternating individual layers X and Y having different compositions from each other.

Because of the compositional gradient of Si, it is possible to provide a hard Si-containing coating layer with improved wear resistance, even on a tough substrate.

One advantage of the invention is that the coating is suitable for sharp edges.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein:

FIG. 1 schematically illustrates a substrate coated with a coating comprising zone A, zone B, and zone C according to an exemplary embodiment of the invention.

DETAILED DESCRIPTION

Embodiments relate to a coated cutting tool that can comprise a PVD coating with an aperiodic, multilayered structure which may have an increased toughness towards the substrate. Referring to FIG. 1, the PVD coating can comprise an outermost zone C being a nitride, carbide, boride, or mixtures thereof, of Si and at least two additional elements selected from Al, Y and groups 4, 5 and 6 of the periodic table and where zone C is free from a compositional gradient of the average content of Si. Zone C may have an aperiodic, multi-layered structure of alternating individual layers X and Y having different compositions from each other. The coating may further comprise a zone A closest to the substrate and a transitional zone B, where:

zone A is essentially free from Si, and zone B comprises a compositional gradient of the average content of Si, where the average content of Si is increasing towards zone C.

Zone B preferably also has an aperiodic, multilayered structure of alternating individual layers X and Y having different compositions from each other.

The phrase "compositional gradient" may be used herein to mean that the average content of Si, for example, measured over a section of the coating and not in a specific point, is increasing or decreasing. For example, a multilayered structure in accordance with an exemplary embodiment of the invention may comprise successive individual layers that vary up or down in Si concentration with regards to each other, but the average Si concentration measured over a plurality of individual layers can increase or decrease.

Zone A can be homogenous if deposited from only one target composition or can have a multilayered structure if deposited from two or more targets having different compositions. In one exemplary embodiment zone A has an aperiodic multilayered structure.

By aperiodic it is understood that the thickness of a particular individual layer in the multilayered structure has no relation to the thickness of an individual layer immediately beneath, nor above the particular individual layer. The multilayered structure may not have any repeating period in a sequence of at least 10 consecutive individual layers.

The phrase "multilayered structure" can be used herein to mean a structure comprising at least 5 individual layers. However, it can comprise up to several thousand individual layers.

The average thickness of the individual layers can suitably be larger than 0.1 nm, but smaller than 200 nm, preferably larger than 0.5 nm, but smaller than 100 nm, most preferably larger than 1 nm, but smaller than 30 nm. The sum of any ten consecutive layers in the multilayered structure can preferably be smaller than 300 nm.

Zone A can be essentially free from Si. Some silicon may be present due to contamination or diffusion but is not purposely added to zone A. The phrase "essentially free" may be used herein to mean that the content of Si is less than 1% of the total amount of metal elements, preferably less than 0.5% and most preferably the content of Si is on a level of an impurity.

In one exemplary embodiment, zone A can be essentially free of Si and Cr. The phrase "essentially free of Cr" can be used herein to mean that the content of Cr is less than 1% of the total amount of metal elements, preferably less than 0.5% and most preferably the content of Cr is on a level of an impurity.

Zone A can preferably comprise one or a combination of TiN, (Ti,Al)N, Ti, AlN, Al, CrN, (Cr,Al)N or Cr. Zone A may have a high toughness, compared to the outer zone. The phrase "high toughness" may be used to mean that the coating has a high resistance against cracking at mechanical load.

Zone C can be a coating layer suitably having a high hardness. The phrase "high hardness" can be used herein to mean that the hardness is suitably above 30 GPa.

Zone B can be a transition zone between zones A and C comprising a compositional gradient of Si so that a part of zone B closest to zone A can have, at least, a Si composition close to that of zone A and a part of zone B closest to zone C can have, at least, a Si composition close to that of zone C. The gradient of the average content Si may not be completely linear due to the production technique, but is in some embodiments preferably as linear as possible. The Si content may vary between the individual sub-layers; however the average Si content measured over several sub-layers can increase throughout zone B. Zone B can also comprise an aperiodic, multilayered, for example, a laminar, structure of alternating layers X and Y.

Zone B may also comprise a gradient of at least two additional elements. For example, the content of other elements (other than Si) of adjacent parts in different zones may be compositionally adapted to each other.

In one exemplary embodiment, the part of zone B closest to zone A may be essentially free of Si.

In another exemplary embodiment, the part of zone B closest to zone A can be essentially free of Si and Cr.

There may be no distinct boundaries between the three zones A, B and C, instead the transition between the different zones may be as smooth as possible. When determining the thickness of the different zones, the boundary between zone A and zone B may be defined as the point where the composition of zone A changes notably, for example, where a gradient starts, preferably at the point where additional elements, other than those in zone A, are introduced.

The boundary between zone B and C can be defined as the point where the coating no longer contains a gradient of an average composition of any element.

The total thickness of zone A and zone B may be suitably between 20 to 95%, preferably between 30 to 80%, more preferably 40 to 80% and most preferably between 40 and 60%, of the total coating thickness.

Zone A may be suitably between 1 to 50%, preferably between 3 and 30%, most preferably between 5 and 15%, of the total thickness of zone A and zone B.

The total thickness of the whole coating may be 0.5 to 20 µm, preferably 1 to 10 µm, most preferably 2 to 5 µm.

All thicknesses given herein may refer to measurements conducted on a reasonably flat surface being in direct line of sight from the targets. For inserts, being mounted on pins sticks during deposition, it may mean that the thickness has been measured on the middle of a side directly facing the target. For irregular surfaces, such as those on, e.g., drills and end mills, the thicknesses given herein may refer to the thickness measured on any reasonably flat surface or a surface having a relatively large curvature and some distance away from any edge or corner. For instance, on a drill, the measurements may have been performed on the periphery, and on an end mill, the measurements may have been performed on the flank side. The measurements provided herein for particular embodiments described have been done on polished cross sections.

The composition of each individual layer in the multilayered structure may not easily be measured without a contribution from adjacent layers due to the low thickness. What can be measured is the average composition over a section of the multilayer structure. The composition of each individual layer can be estimated from the composition of the targets used but that may not give an exact composition. When thicker layers have been deposited, thick enough to be analysed, it has been shown that the composition of the deposited layers can differ with a few percentage compared to the composition of the target material. Due to this fact, any composition of the individual layers of the multilayered structure mentioned hereinafter is an estimation from the compositions of the targets used during the deposition.

The coating can comprise a nitride, carbide, boride, or mixtures thereof, of Si and at least two additional elements selected from Al, Y and groups 4, 5 or 6 of the periodic table. The elements can be suitably Si and at least two of Ti, Al and Cr. Preferably the coating comprises the elements Si, Ti, Al and Cr.

In one exemplary embodiment, the coating is a nitride.

In another exemplary embodiment, the coating is a nitride comprising the elements Si, Ti, Al and Cr.

In one exemplary embodiment, an average composition of the multilayered structure in zone C is $(Ti_{(1-a-b-c)}Al_aCr_bSi_c)N$ where $0<a<0.5$, preferably $0.05<a<0.4$, most preferably $0.25<a<0.3$; where $0<b<0.15$, preferably $0.02<b<0.10$, most preferably $0.04<b<0.08$; where $0.01<c<0.17$, preferably $0.02<c<0.10$, most preferably $0.04<c<0.08$; and where $a+b+c<1$.

In another exemplary embodiment, an average composition of the multilayered structure in zone C is $(Ti_{(1-a-b-c)}Al_aCr_bSi_c)N$ where $0<a<0.5$, preferably $0.05<a<0.4$, most preferably $0.25<a<0.3$; where $0<b<0.17$, preferably $0.06<b<0.15$, most preferably $0.10<b<0.15$; where $0.01<c<0.17$, preferably $0.02<c<0.10$, most preferably $0.04<c<0.08$; and where $a+b+c<1$.

The average chemical composition of the multilayered structure can be measured using EDS (Energy Dispersive Spectroscopy) over a cross section of the coating.

In one exemplary embodiment, the composition of the individual layers X and Y in zone B and zone C can be any one of CrN, (Al,Cr)N, (Ti,Si)N, (Al,Ti,Si)N, TiN, (Al,Si)N and (Al,Ti,Cr,Si)N.

In one exemplary embodiment, zone C can comprise a multilayered structure of alternating (Al,Cr)N and (Ti,Si)N individual layers.

In one exemplary embodiment, the substrate can be a cutting tool insert of cemented carbide, cermets, ceramics or cubic boron nitride or high speed steel.

In one exemplary embodiment, the substrate can be a drill or end mill of cemented carbide or high speed steel.

Another exemplary embodiment can relate to a method of making the coated cutting tool as described above. The method can comprise the steps of providing a substrate of cemented carbide, cermets, ceramics, cubic boron nitride or high speed steel; onto said substrate depositing, by PVD technique, a coating comprising an outermost zone C being a nitride, carbide, boride, or mixtures thereof, of Si and at least two additional elements selected from Al, Y and groups 4, 5 or 6 of the periodic table, where zone C is free from a compositional gradient of the average content of Si, and where zone C has an aperiodic, multilayered structure of alternating individual layers X and Y having different compositions from each other. The coating can further comprise a zone A closest to the substrate and a transitional zone B between zone A and zone C, where:

zone A can be essentially free from Si, and zone B can comprise a compositional gradient of the average content of Si, where the average content of Si can increase towards zone C.

Zone B preferably may have an aperiodic, multilayered structure, for example, laminar, of alternating individual layers X and Y having different compositions from each other.

In one exemplary embodiment, zone A can be essentially free of Si and Cr.

The total thickness of zone A and zone B can suitably be between 20 to 95%, preferably between 30 to 80%, more preferably 40 to 80% and most preferably between 40 and 60%, of the total coating thickness.

Zone A can suitably be between 1 to 50%, preferably between 3 and 30%, most preferably between 5 and 15%, of the total thickness of zone A and zone B.

The method can be applied to all common PVD techniques, like cathodic arc evaporation, magnetron sputtering, high power pulsed magnetron sputtering (HPPMS), ion plating, etc. Preferably cathodic arc evaporation or magnetron sputtering may be used. The process parameters are conventional in the art for depositing PVD coatings onto substrates and depend on the specific deposition equipment, coating composition etc. Typically, the deposition temperature varies between 100 and 900° C.

The pressure during deposition can typically be between 0.1 to 10 Pa of the process gas present. The process gas can be one or more of $N_2$, Ar, $C_2H_2$, $CH_4$, or silicon containing gases depending on the aimed coating composition.

The silicon can either originate from a target or from a silicon-containing process gas, e.g. trimethylsilane.

The coatings comprising the multilayered structure can be deposited by different PVD techniques and alternately forming individual layers. The aperiodic sequence of the individual layer thicknesses can be made by randomly or in a predetermined non-repetitive manner opening and closing shutters from individual layer targets, or by randomly or in a predetermined non-repetitive manner switching said targets on and off. Another conceivable method may be by randomly or in a predetermined non-repetitive manner rotating or moving the to-be-coated substrates, in front of said targets. This is preferably done by placing the substrates on a 3-fold rotating substrate table arranged to obtain an aperiodic multilayered structure. The 3-fold rotation can be adjusted with regard to rotating speed and rotating direction, clockwise or counter clockwise.

The multilayered structure can be deposited in such a way that the average thickness of the individual layers is larger than 0.1 nm, but smaller than 200 nm, preferably larger than 0.5 nm, but smaller than 100 nm, most preferably larger than 1 nm, but smaller than 30 nm. The sum of the individual thicknesses of any ten consecutive layers in the multilayered structure may be smaller than 300 nm.

The different zones can be formed by depositing from different combinations of active targets. The non-active targets may either be switched off or fully or partly shielded. When zone A is formed, preferably only a pure Ti target, pure Cr target, CrAl or a TiAl target may be active during deposition. If zone A is intended to be pure metallic Ti, no nitrogen gas may be present, but if zone A is intended to be a metal nitride, nitrogen gas can be present. When starting to form zone B, the target containing the remaining elements can be switched on, or a shield can be gradually removed, and the material flow from the target can be gradually increased either by increasing the current to those targets or by the degree of shielding.

Zone C may then be deposited by running the targets at a constant current by using targets of elements selected from Si, Al, Y and groups 4, 5 or 6 of the periodic table. Each target can comprise one, two or more elements each. The composition of the metal elements in the targets can be different from the average composition of the metal elements in the whole multilayered structure and still form coatings. However zone C as a whole may contain Si and at least two additional elements selected from Al, Y and groups 4, 5 or 6 of the periodic table.

In one exemplary embodiment the elements in the targets comprise titanium (Ti), aluminium (Al), silicon (Si), chromium (Cr), or alloys thereof, in an $N_2$ or mixed $N_2$+Ar gas atmosphere. Targets may comprise carbon and/or boron in order to form carbides or borides, respectively.

In one exemplary embodiment the targets used to make zone C are any one of (Al,Ti) (Al,Cr), (Ti,Si), (Al,Ti,Si), Ti, (Al,Si) and (Al,Ti,Cr,Si).

In one exemplary embodiment, the targets used to make zone C are (Al,Cr) and (Ti,Si).

In one exemplary embodiment, the silicon may be at least partly provided by adding a silicon-containing gas. The amount of Si can then be controlled by adjusting the flow of the silicon-containing gas.

In one exemplary embodiment, the average composition of the multilayered structure in zone C made according to the method can be $(Ti_{(1-a-b-c)}Al_aCr_bSi_c)N$, where $0<a<0.5$, preferably $0.05<a<0.4$, most preferably $0.25<a<0.3$; where $0<b<0.15$, preferably $0.02<b<0.10$, most preferably $0.04<b<0.08$; where $0.01<c<0.17$, preferably $0.02<c<0.10$, most preferably $0.04<c<0.08$; and where $a+b+c<1$.

In another exemplary embodiment the Cr content can be $0<b<0.17$, preferably $0.06<b<0.15$, most preferably $0.10<b<0.15$, otherwise the same.

The thickness of the whole coating can be 0.5 to 20 μm, preferably 1 to 10 μm, most preferably 2 to 5 μm.

In one exemplary embodiment, the substrate used in the method may be a cutting tool insert of cemented carbide, cermets, ceramics or cubic boron nitride.

In one exemplary embodiment, the substrate used in the method may be a drill or end mill of cemented carbide or high speed steel.

In one exemplary embodiment, the method may further comprise a post treatment step. The post treatment step can be, e.g., a brushing, blasting, shot peening, etc.

Example 1

An Exemplary Embodiment of the Invention

Cemented carbide drills were coated in a PVD arc evaporation equipment using Ti, $Ti_{0.90}Si_{0.10}$ and $Al_{0.70}Cr_{0.30}$ targets. The deposition temperature was 450° C. for the whole deposition. During the whole deposition the drills were rotated in 3-fold rotation to achieve an aperiodic structure.

The deposition was started with a standard Ar plasma etching step to clean the substrate surface. Then, zone A was formed of TiN from a Ti target and nitrogen gas, at a bias of −200 to −100 V in two steps. When zone A had reached a thickness of approximately 0.15 μm, the deposition of zone B was started by switching on the $Al_{0.70}Cr_{0.30}$ target and the deposition was continued from both the $Al_{0.70}Cr_{0.30}$ targets and the Ti target while the current to the $Al_{0.70}Cr_{0.30}$ target was gradually increased. After a while the $Ti_{0.90}Si_{0.10}$ target was switched on as well and the current to the $Ti_{0.90}Si_{0.10}$ target was gradually increased until zone A and zone B had reached a thickness of approximately 2 μm. The bias voltage during deposition of zone B was −60 V.

Zone C was then deposited by running the $Al_{0.70}Cr_{0.30}$ and $Ti_{0.90}Si_{0.10}$ targets at a constant current while subjecting the drills to a 3-fold rotation until zone C had reached a thickness of approximately 2 μm. The bias voltage during deposition of zone C was −40 V.

Example 2

Prior Art

Cemented carbide drills having the same composition and geometry as in Example 1 were coated in the same equipment as in Example 1. The deposition was started with the same etching step as described in Example 1. The deposition temperature was 450° C. and the bias voltage was −40 V.

The coating was then deposited by switching on both $Al_{0.70}Cr_{0.30}$ and $Ti_{0.90}Si_{0.10}$ targets and the coating was then deposited by running the targets at a constant current while subjecting the drills to a 3-fold rotation until a total coating thickness of approximately 4 μm was obtained.

Example 3

The drills made according to Examples 1 and 2 were tested together with a commercial drill with a (Ti,Al)N coating called Comparative, and a TiAlCrSiN multilayer as described in EP 1 939 328 A1 called prior art, in a cutting operation making 20 mm through holes at the following cutting data:

| Work piece material | SS2244 |
|---|---|
| Cutting speed | 90 m/min |
| Feed | 0.15 mm/turn |
| Internal cooling | 2.8-3.5 l/min |

Tool life criteria were any of:
$v_B$(flank wear)>0.3 mm on main cutting edge;
$v_B$>0.5 mm on outer corner or chipping of the same sizes; and
bad chip formation (as thread chips), sounds or force increase that would lead to the assumption that the proceeding will lead to total breakage.

Table 1 presents the number of holes drilled until any of the tool life criterions was reached.

TABLE 1

|  | Number of holes |
|---|---|
| Exemplary Embodiment of the Invention | 2 000 |
| Prior art | 1 370 |
| Comparative | 1 360 |

It is clear from Table 1 that the coating according to the present invention can have a longer tool life than the prior art drill and the commercial drill (Comparative) in this operation.

While the invention has been described in connection with various exemplary embodiments, it is to be understood that the invention is not to be limited to the disclosed exemplary embodiments, on the contrary, it is intended to cover various modifications and equivalent arrangements within the appended claims.

The invention claimed is:
1. A coated cutting tool comprising:
a substrate and
a PVD-coating,
wherein the coating comprises an outermost zone C being a nitride, carbide, boride, or mixtures thereof, of Si and at least two additional elements selected from Al, Y, and groups 4, 5 or 6 of the periodic table,
wherein zone C is free from a compositional gradient of an average content of Si, and
wherein zone C has an aperiodic, multilayered structure of alternating individual layers X and Y having different compositions from each other,
wherein the coating further comprises a zone A closest to the substrate and a transitional zone B between zone A and zone C where:
zone A is essentially free from Si, zone B comprises a compositional gradient of the average content of Si, where the average content of Si is increasing towards zone C, and zone B has an aperiodic multilayer structure of alternating individual layers X and Y having different compositions from each other.

2. The coated cutting tool of claim 1, wherein zone A comprises at least one of TiN, (Ti, Al)N, Ti, AlN, Al, CrN, (CrAl)N and Cr.

3. The coated cutting tool of claim 1, wherein the PVD-coating is a nitride.

4. The coated cutting tool of claim 1, wherein the PVD-coating is a nitride of the elements Si, Cr, Al and Ti.

5. The coated cutting tool of claim 1, wherein a total thickness of zone A and zone B is between 20% to 95% of a total coating thickness.

6. The coated cutting tool of claim 1, wherein zone A is between 1 to 50% of a total thickness of zone A and zone B.

7. The coated cutting tool of claim 1, wherein a thickness of the individual layers in the multilayered structure is larger than 0.1 nm but smaller than 200 nm.

8. The coated cutting tool of claim 1, wherein a total thickness of the PVD-coating is 0.5 to 20 μm.

9. A method of making a coated cutting tool comprising the steps of:

providing a substrate of cemented carbide, cermets, ceramics, cubic boron nitride or high speed steel, onto said substrate depositing, by PVD technique, a coating comprising an outermost zone C being a nitride, carbide, boride, or mixtures thereof, of Si and at least two additional elements selected from Al, Y, and groups 4, 5 or 6 of the periodic table, wherein zone C is free from a compositional gradient of an average content of Si, wherein zone C has an aperiodic, multilayered structure of alternating individual layers X and Y having different compositions from each other, and wherein the coating further comprises a zone A closest to the substrate and a transitional zone B between zone A and zone C, where zone A is essentially free from Si, zone B comprises a compositional gradient of the average content of Si, where the average content of Si is increasing towards zone C, and zone B has an aperiodic multilayer structure of alternating individual layers X and Y having different compositions from each other.

10. The method of claim 9, wherein a total thickness of zone A and zone B is between 20 to 95% of a total coating thickness.

11. The method of claim 9, wherein zone A is between 1 to 50% of a total thickness of zone A and zone B.

12. The method of claim 9, wherein a thickness of the individual layers in the multilayered structure is larger than 0.1 nm but smaller than 200 nm.

13. The method of claim 9, wherein the PVD-coating is a nitride of the elements Si, Cr, Al and Ti.

14. The coated cutting tool of claim 1, wherein a composition of individual layers X and Y in zone B is CrN, (Al,Cr)N, (Ti,Si)N, (Al,Ti,Si)N, TiN, (Al,Si)N or (Al, Ti, Cr, Si)N.

15. The coated cutting tool of claim 1, wherein a composition of individual layers X and Y in zone C is CrN, (Al,Cr)N, (Ti,Si)N, (Al,Ti,Si)N, TiN, (Al,Si)N or (Al, Ti, Cr, Si)N.

16. A coated cutting tool comprising:

a substrate; and a PVD-coating, wherein the coating comprises an outermost zone C, which is free from a compositional gradient of an average content of Si, and has an aperiodic, multilayered structure of alternating individual layers X and Y having compositions of (Al, Cr)N and (Ti, Si)N, respectively, and wherein the coating further comprises a zone A closest to the substrate and a transitional zone B between zone A and zone C where:

zone A is essentially free from Si, zone B comprises a compositional gradient of the average content of Si, where the average content of Si is increasing towards zone C, and zone B has an aperiodic multilayer structure of alternating individual layers X and Y having different compositions from each other.

\* \* \* \* \*